United States Patent
Ookawa et al.

(10) Patent No.: US 7,557,575 B2
(45) Date of Patent: Jul. 7, 2009

(54) MAGNETIC RESONANCE IMAGING APPARATUS AND MAGNETIC RESONANCE IMAGING METHOD

(75) Inventors: Masashi Ookawa, Otawara (JP); Hitoshi Kanazawa, Utsunomiya (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 0 days.

(21) Appl. No.: 11/727,441

(22) Filed: Mar. 27, 2007

(65) Prior Publication Data
US 2007/0229075 A1    Oct. 4, 2007

(30) Foreign Application Priority Data
Apr. 4, 2006   (JP) ............................. 2006-103271

(51) Int. Cl.
*G01V 3/00* (2006.01)
(52) U.S. Cl. ................... 324/309; 324/307; 324/312
(58) Field of Classification Search ............... 324/309, 324/307, 312
See application file for complete search history.

(56) References Cited

U.S. PATENT DOCUMENTS

| | | | | |
|---|---|---|---|---|
| 4,656,426 A | * | 4/1987 | Yamada et al. | 324/309 |
| 4,673,880 A | * | 6/1987 | Compton et al. | 324/309 |
| 4,952,877 A | * | 8/1990 | Stormont et al. | 324/312 |
| 5,151,656 A | | 9/1992 | Maier et al. | |

FOREIGN PATENT DOCUMENTS

| | | |
|---|---|---|
| JP | 6-22928 | 2/1994 |
| JP | 2005-28019 | 2/2005 |

* cited by examiner

*Primary Examiner*—Louis M Arana
(74) *Attorney, Agent, or Firm*—Nixon & Vanderhye PC

(57) ABSTRACT

A magnetic resonance imaging apparatus includes a data acquisition unit, a frequency offset acquisition unit, a frequency modulation unit and a phase shift correction unit. The data acquisition unit acquires pieces of echo data due to nuclear magnetic resonance after applying an excitation pulse. The frequency offset acquisition unit acquires a frequency offset. The frequency modulation unit frequency-modulates the excitation pulse according to the frequency offset. The phase shift correction unit cancels a phase shift occurring on each of the pieces of the echo data due to a frequency modulation according to the frequency offset during a readout of the pieces of the echo data.

8 Claims, 12 Drawing Sheets

MAGNETIC RESONANCE IMAGING APPARATUS AND MAGNETIC RESONANCE IMAGING METHOD

BACKGROUND OF THE INVENTION

1. Field of the Invention

The present invention relates to a magnetic resonance imaging apparatus and a magnetic resonance imaging method which excites nuclear spins of an object with a RF (radio frequency) signal having the Larmor frequency and reconstructs an image based on a MR (magnetic resonance) signal generated in response to the excitation, and more particularly, to a magnetic resonance imaging apparatus and a magnetic resonance imaging method which make it possible to reduce positional shift of an image due to frequency correction of an excitation pulse with a frequency offset.

2. Description of the Related Art

MRI (magnetic resonance imaging) is an imaging method that excites atomic nuclei spins of objects put in a static magnetic field by RF signals having a Larmor frequency and then reconstructs an image from MR signals which occur in response to this excitation.

Up to now, in the MRI field, shimming to adjust uniformity of a static magnetic field is performed to lower degradation of image quality caused by influence of non-uniformity in the static field. And, a resonant frequency of protons that are included in an imaging cross-section in the static magnetic field adjusted by shimming is obtained by a pre-scan and a frequency offset to set a previously adjusted center frequency of an RF excitation pulse to a resonant frequency according to an imaging cross section. Additionally, on a scan for diagnostic imaging performed following the pre-scan, an RF excitation pulse center frequency is shifted by the frequency offset and used for excitation of protons (for example, refer to Japanese Patent Application (Laid-Open) No. 7-327960).

Techniques of magnetic resonance imaging are also known where, to get a large FOV (field of view) in the direction of a moving patient supporting bed table, the table may be moved continuously while imaging. A similar stepping-table method is known as well to perform 3D (three-dimensional) imaging by moving the bed table by steps while an injection of contrast medium provides images to be projected (for example, refer to Japanese Patent Application (Laid-Open) No. 8-71056 and Japanese Patent Application (Laid-Open) No. 2002-95646). These techniques can be used for the case of imaging a wide area which cannot be imaged all at once e.g., imaging of the whole body). Plural images which are collected in conjunction with moving the bed are combined with each other by compound processing. By this, an image of the wide area can be obtained.

In recent years, in the field of magnetic resonance imaging, a scan under EPI (Echo Planar Imaging) method collects plural echo signals sequentially by sequentially inverting a gradient magnetic field at a high speed after one excitation of nuclear resonance. However, using this EPI method, if an excitation pulse is frequency-modulated using the gradient magnetic field offset and the frequency offset which were obtained by shimming, then also on each collected set of echo data, a similar phase shift according to the frequency modulation occurs while the echo is read out. Accordingly, if an image is reconstructed from the echo data which is obtained by the EPI method with frequency correction using the frequency offset, an image under the influence of the phase shift is obtained. Which is to say, the frequency offset which was obtained by shimming is used with the gradient magnetic field offset. Furthermore, the frequency offset can be used not only for modulation of an excitation pulse and but also for frequency modulation that is needed while the echo is read out.

Especially, in the case of a scan by SS SE EPI (Single Shot Spin Echo Planar Imaging) method, there is a problem that influence of the phase shift on the echo data comes out noticeably on an image. In imaging under SS SE EPI method, a refocus pulse is impressed following impression of an excitation pulse and a lot of echo data are collected sequentially on a section of collecting data of SE (Spin Echo) method to collect echo data by inversion of the gradient magnetic field, thereby imaging one image by one excitation. Because of this, in imaging by the SS SE EPI method, every time echo data is collected, a shift amount the same as the frequency shift of the excitation pulse becomes a phase shift and is overlayed onto the echo data while echo data is read out. Accordingly, as the later echo data is collected, the larger phase shift exists thereon. Further, the phase shift that overlays onto the echo data appears as a positional shift on image data after Fourier transform.

FIG. 16 is a diagram showing one example of an image which was obtained by a scan under the conventional SS SE EPI method.

FIG. 16 is a sagittal cross-section image of a cylindroid of copper sulfate bottle phantom. This sagittal cross-section image was created by the way that multiple axial cross-section images which are included in an area having about 15 cm width in the axial direction are acquired by the SS SE EPI sequence and MPR multi-planar reconstruction) processing is performed to the acquired axial cross-section images.

On the image shown in FIG. 16, image distortion by a position shift of image data due to influence of frequency modulation on an excitation pulse is observed. That is to say, lateral ends of the copper sulfate bottle phantom shift upward.

Such an image position shift results from a phase shift while echo data is read out which occurs at a frequency corresponding to the frequency offset which was used for an excitation pulse for the frequency correction. This is a phenomenon which can happen to all imaging methods commonly used to collect multiple echo data sequentially after excitation as well as the SS SE EPI method.

Furthermore, in the case of generating a single image by combining multiple images (e.g., imaging with moving a bed), there is a case that a step discontinuity occurs on connection of parts of images each other and discontinuity occurs to the images if a position shift exists on each image serving as an object to be combined.

SUMMARY OF THE INVENTION

The present invention has been made in light of the conventional situations, and it is an object of the present invention to provide a magnetic resonance imaging apparatus and a magnetic resonance imaging method which make it possible to reduce positional shift of an image due to frequency correction of an excitation pulse with a frequency offset and a phase shift which occurs at a similar frequency during readout of echo data.

The present invention provides a magnetic resonance-imaging apparatus comprising: a data acquisition unit configured to acquire pieces of echo data due to nuclear magnetic resonance after applying an excitation pulse; a frequency offset acquisition unit configured to acquire a frequency offset; a frequency modulation unit configured to frequency-modulate the excitation pulse according to the frequency offset; and a phase shift correction unit configured to cancel a phase shift occurring on each of the pieces of echo data due to a frequency modulation according to the frequency offset during a readout of the pieces of echo data, in an aspect to achieve the object.

The present invention also provides a magnetic resonance imaging method comprising steps of: acquiring pieces of echo data due to nuclear magnetic resonance after applying an excitation pulse; acquiring a frequency offset; frequency-modulating the excitation pulse according to the frequency offset; and canceling a phase shift occurring on each of the pieces of echo data due to a frequency modulation according to the frequency offset during a readout of the pieces of echo data, in an aspect to achieve the object.

The magnetic resonance imaging apparatus and the magnetic resonance imaging method as described above make it possible to reduce positional shift of an image due to frequency correction of an excitation pulse with a frequency offset and a phase shift which occurs at a similar frequency during readout of echo data.

DESCRIPTION OF THE PREFERRED EMBODIMENTS

A magnetic resonance imaging apparatus and a magnetic resonance imaging method according to embodiments of the present invention will be described with reference to the accompanying drawings.

Figure 1:
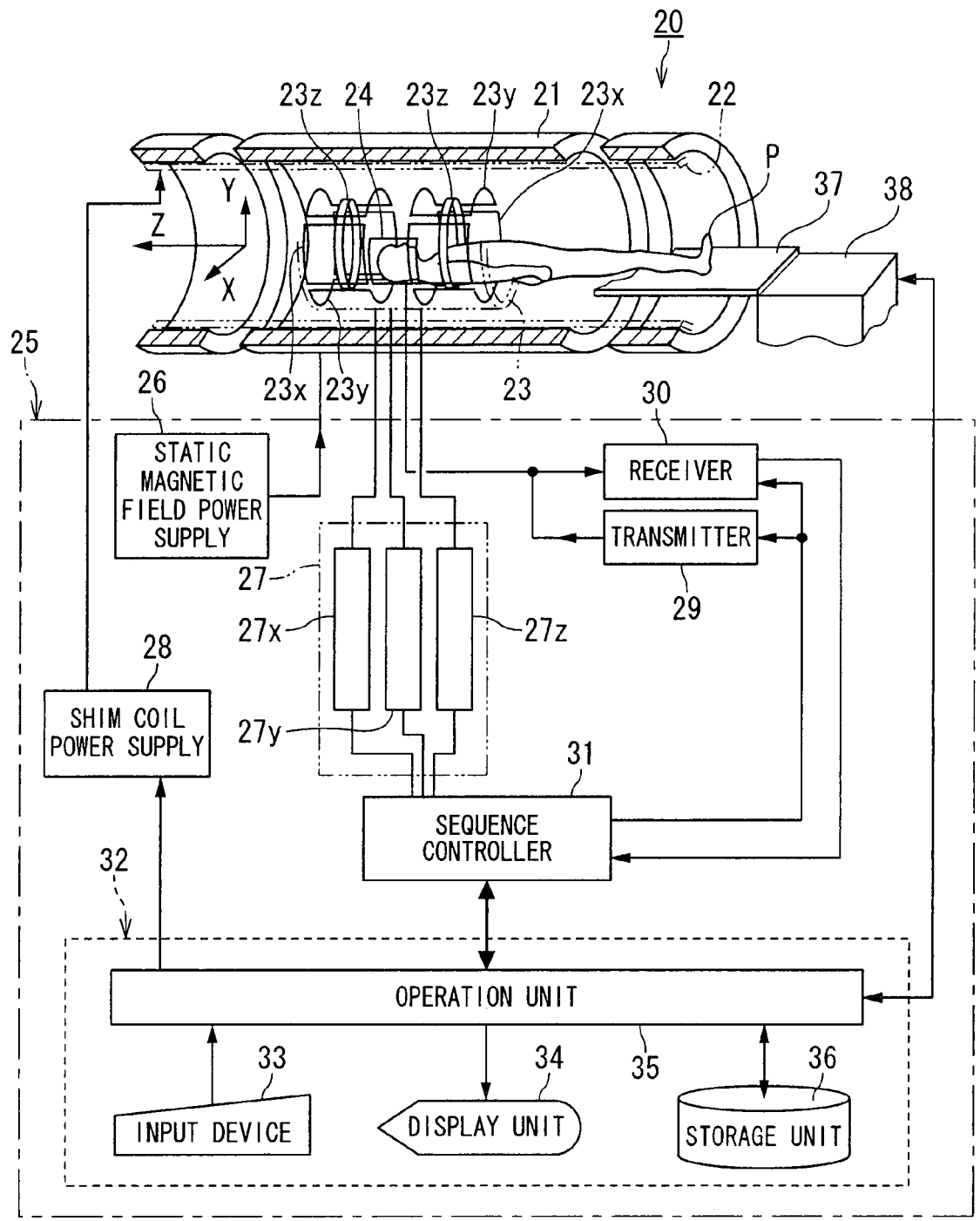
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil unit 23 and a RF coil unit 24. The static field magnet 21, the shim coil 22, the gradient coil unit 23 and the RF coil unit 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a monitor 34, an operation unit 35 and a storage unit 36.

The static field magnet 21 communicates with the static magnetic field power supply 26. The static magnetic field power supply 26 supplies electric current to the static field magnet 21 to get the function to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil unit 23 includes an X-axis gradient coil unit 23x, a Y-axis gradient coil unit 23y and a Z-axis gradient coil unit 23z. Each of the X-axis gradient coil unit 23x, the Y-axis gradient coil unit 23y and the Z-axis gradient coil unit 23z which is cylinder-shaped is arranged inside the static field magnet 21. The gradient coil unit 23 has also a bed 37 in the area formed inside it which is an imaging area. The bed 37 supports an object P. Around the bed 37 or the object P, the RF coil unit 24 may be arranged instead of being built in the gantry.

The gradient coil unit 23 communicates with the gradient power supply 27. The X-axis gradient coil unit 23x, the Y-axis gradient coil unit 23y and the Z-axis gradient coil unit 23z of the gradient coil unit 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil unit 23x, the Y-axis gradient coil unit 23y and the Z-axis gradient coil unit 23z respectively so as to generate gradient magnetic fields Gx, Gy and Gz in the X, Y and Z directions in the imaging area.

The RF coil unit 24 communicates with the transmitter 29 and the receiver 30. The RF coil unit 24 has a function to transmit a radio frequency signal given from the transmitter 29 to the object P and receive an NMR signal generated due to a nuclear spin inside the object P which is excited by the Radio frequency signal to give to the receiver 30.

Figure 2:
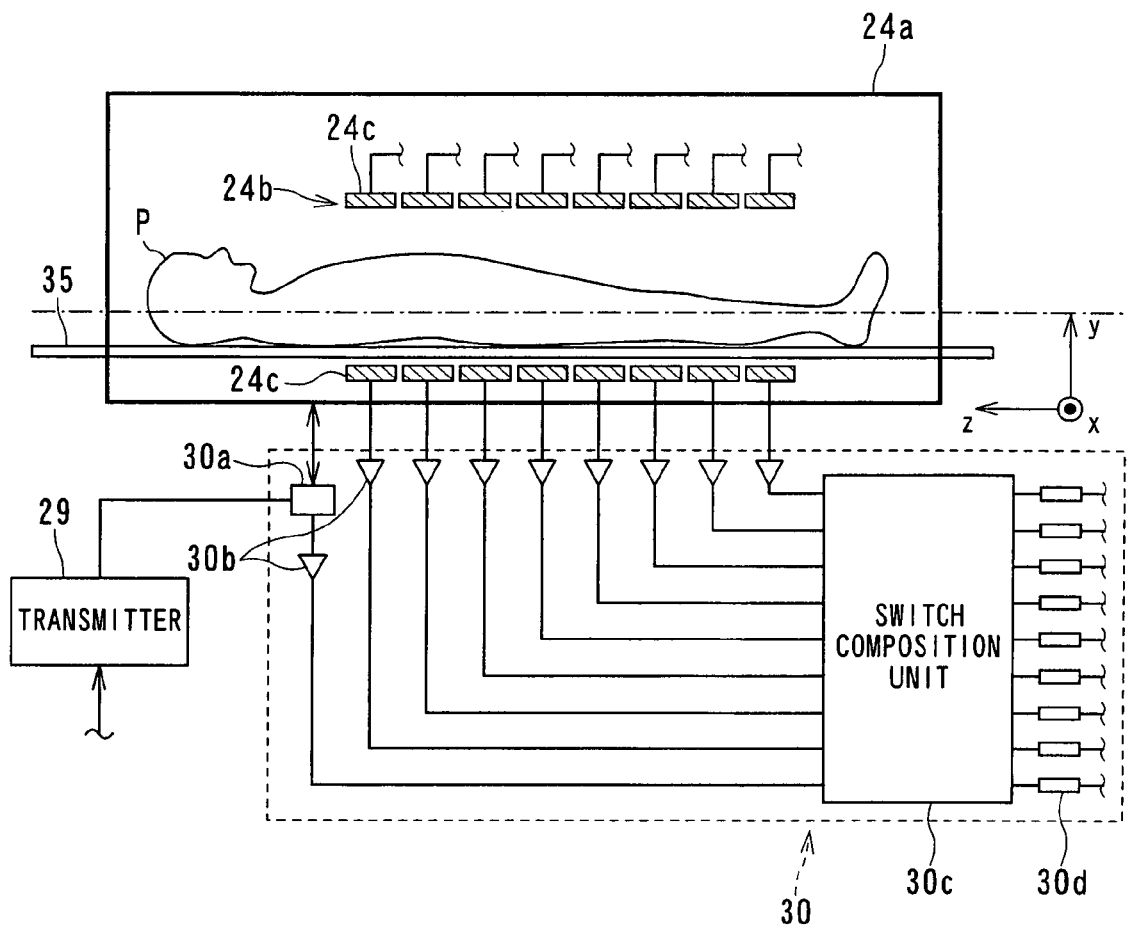
FIG. 2 is a diagram showing an example of detail structure of the RF coil unit shown in FIG. 1.
Figure 3:
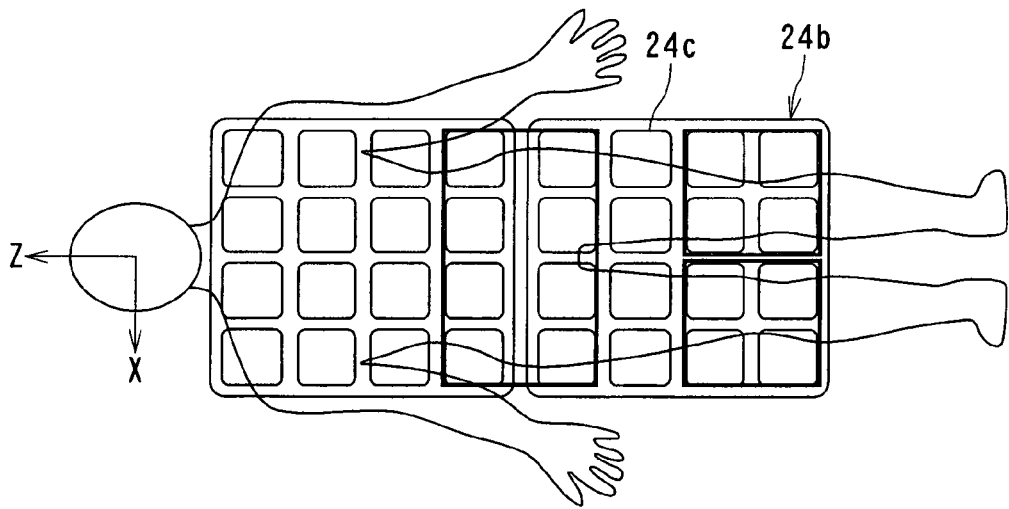
FIG. 3 is a diagram showing an example arrangement of the surface coils set on the body surface side of the object shown in FIG. 2.
Figure 4:
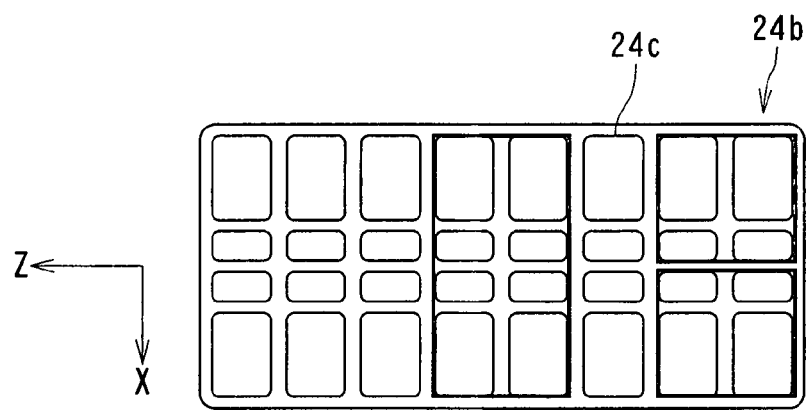
FIG. 4 is a diagram showing an example arrangement of the surface coils set on the back surface side of the object shown in FIG. 2.

FIG. 2 is a diagram showing an example of detail structure of the RF coil unit 24 shown in FIG. 1. FIG. 3 is a diagram showing an example arrangement of the surface coils 24c set on the body surface side of the object P shown in FIG. 2. FIG. 4 is a diagram showing an example arrangement of the surface coils 24c set on the back surface side of the object P shown in FIG. 2.

As shown in FIG. 2, the RF coil unit 24 includes a cylindrical WB (whole-body) coil 24a, and a phased array coil 24b. The phased array coil 24b includes a plurality of surface coils 24c, and a plurality of the surface coils 24c is arranged on each of the body surface side and the back surface side of the object P.

For example, as shown in FIG. 3, on the body surface side of the object P, four rows of surface coils 24c are provided in the x-direction and eight columns of them in the z-direction, that is, a total of thirty two surface coils 24c are arranged so as to cover a wide-ranging imaging area. Likewise, as shown in FIG. 4, on the back surface side of the object, four rows of surface coils 24c are provided in the x-direction and eight columns of them in the z-direction, that is, a total of thirty two surface coils 24c are arranged so as to cover a wide-ranging imaging area. On the back surface side, surface coils 24 with a smaller size than that of the other surface coils 24c are arranged in the vicinity of the body axis from the viewpoint of sensitivity improvement, considering for the presence of the backbone of the object P.

On the other hand, the receiver 30 includes a duplexer 30a, amplifiers 30b, a switch composition unit 30c, and reception circuits 30d. The duplexer 30a is connected to the transmitter 29, the WB coil 24a, and the amplifier 30b for the WB coil 24a. The amplifiers 30b are provided by the total number of the surface coils 24c and the WB coil 24a, and each connected to a respective one of the surface coils 24c and the WB coil 24a. The switch composition unit 30c consists of a single piece or a plurality of pieces. The input side of the switch composition unit 30c is connected to the plurality of surface coil units 24c or the WB coil 24a through the plurality of amplifiers 30b. The reception circuits 30d are provided by a desired number such as to be smaller than or equal to the total number of the surface coils 24c and the WB coil 24a, and disposed on the output side of the switch composition unit 30c.

The WB coil 24a can be used as a coil for the transmission of radio frequency signals. As a coil for the reception of NMR signals, each of the surface coils 24c can be used. Furthermore, the WB coil 24a can also be used for a receiving coil.

Therefore, the duplexer 30a is configured so as to provide the WB coil 24a with radio frequency signals for transmission, outputted from the transmitter 29, while providing the switch composition unit 30c with NMR signals received in the WB coil 24a via the amplifiers 30b in the receiver 30. An NMR signal received in each of the surface coils 24c is outputted to the switch composition unit 30c via a respective one of the amplifiers 30b.

The switch composition unit 30c is configured so as to perform composition processing and switching with respect to NMR signals received from the surface coils 24c or the WB coil 24a and to output them to the corresponding reception circuits 30d. In other words, the switch composition unit 30c is configured so that, in conformance with the number of the reception circuits 30d, the composition processing and switching with respect to NMR signals received from the surface coils 24c or the WB coil 24a are performed in the switch composition unit 30c, and that NMR signals can be received from various imaging areas by forming sensibility distributions in response to the imaging areas, using a plurality of desired surface coils 24c.

However, NMR signals may be received by WB coil 24a alone without providing the surface coils 24c. Also, NMR signals received in the surface coils 24c or the WB coil 24a may be directly outputted to the reception circuits 30d without providing the switch composition unit 30c. Furthermore, more surface coils 24c may be extensively arranged.

Figure 5:
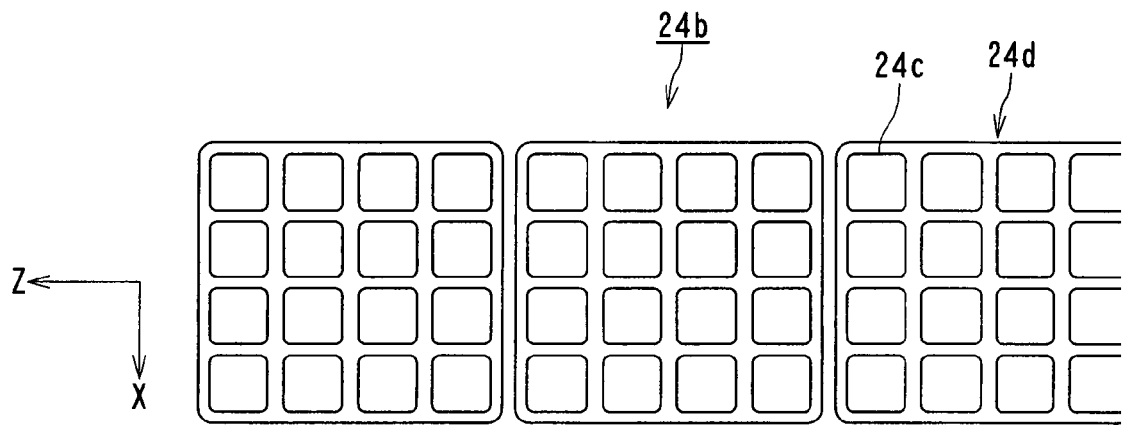
FIG. 5 is a diagram showing another example arrangement of the surface coils set on the body surface side of the object shown in FIG. 2.
Figure 6:
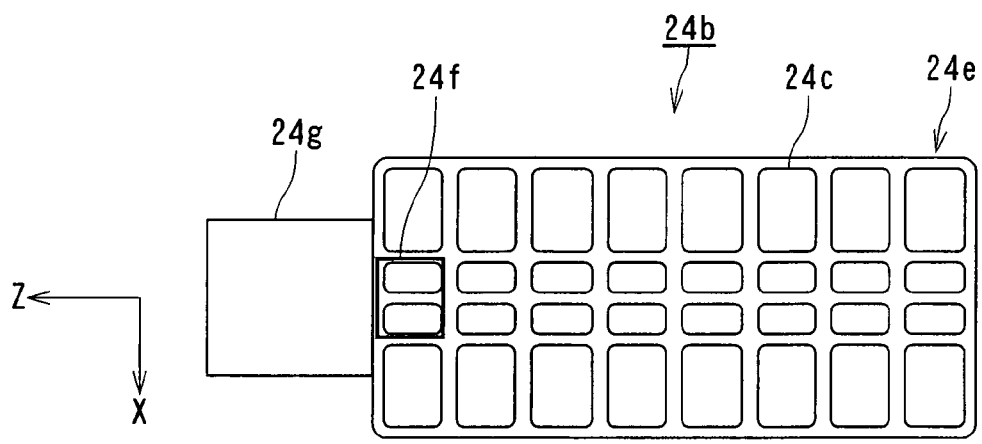
FIG. 6 is a diagram showing another example arrangement of the surface coils set on the back surface side of the object shown in FIG. 2.

FIG. 5 is a diagram showing another example arrangement of the surface coils 24c set on the body surface side of the object P shown in FIG. 2. FIG. 6 is a diagram showing another example arrangement of the surface coils 24c set on the back surface side of the object P shown in FIG. 2

As shown in FIGS. 5 and 6, further more surface coils 24c may be arranged around the object P. In an example shown in FIG. 5, three coil units 24d each composed of sixteen elements constituted of four columns of surface coils 24c in the x-direction and four rows of surface coils 24c in the z-direction are arranged in the z-direction, that is, a total of forty eight elements of surface coils 24c are arranged on the body surface side of the object P. On the other hand, in an example shown in FIG. 6, a coil unit 24e composed of thirty two elements. constituted of four columns of surface coils 24c in the x-direction and eight rows of surface coils 24c in the z-direction are arranged on the backbone side of the object P; a coil units 24f having surface coils 24c composed of two elements (not shown) are arranged in the vicinity of jaws; and further a coil unit 24g having surface coils 24c composed of twelve elements (not shown) are arranged under the head, that is, a total of forty six elements of surface coils 24c are arranged on the back surface side of the object P. Arranging the surface coils 24c on the body surface side and back surface side of the object P as shown in FIGS. 5 and 6 results in that a total of ninety four elements of surface coils 24c are arranged around the object P. Each of the surface coils 24c is connected to a respective exclusive one of the amplifiers 30b via a coil port (not shown).

Arranging a multitude of surface coils 24c around the object P makes it possible to form a phased array coil 24b for the whole-body, capable of receiving data from a plurality of imaging areas without moving the positions of the coils or that of the object P. Although the WB coil 24a can also receive data from a plurality of imaging areas without moving the positions of the coils or that of the object P, the use of the phased array coil 24b as a receiving coil allows data to be received with sensitivities more suitable for the imaging areas and with a better signal-to-noise ratio (SNR).

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a radio frequency signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27.

The sequence controller 31 is also configured to give raw data to the computer 32. The raw data is complex number data obtained through the detection of an NMR signal and A/D conversion to the NMR signal detected in the receiver 30.

The transmitter 29 has a function to give a radio frequency signal to the RF coil unit 24 in accordance with control information provided from the sequence controller 31. The receiver 30 has a function to generate raw data which is digitized complex number data by detecting an NMR signal given from the RF coil unit 24 and performing predetermined signal processing and A/D converting to the NMR signal detected. The receiver 30 also has a function to give the generated raw data to the sequence controller 31.

Furthermore, the bed 37 provided with a table drive unit 38. The table drive unit 38 is connected with the computer 32. The table drive unit 38 is configured to move the table of the bed 37 by controlling from the computer 32 so as to perform imaging under moving table method or stepping table method.

The computer 32 gets various functions by the operation unit 35 executing some programs stored in the storage unit 36 of the computer 32. The computer 32 may include some specific circuits instead of using some of the programs.

Figure 7:
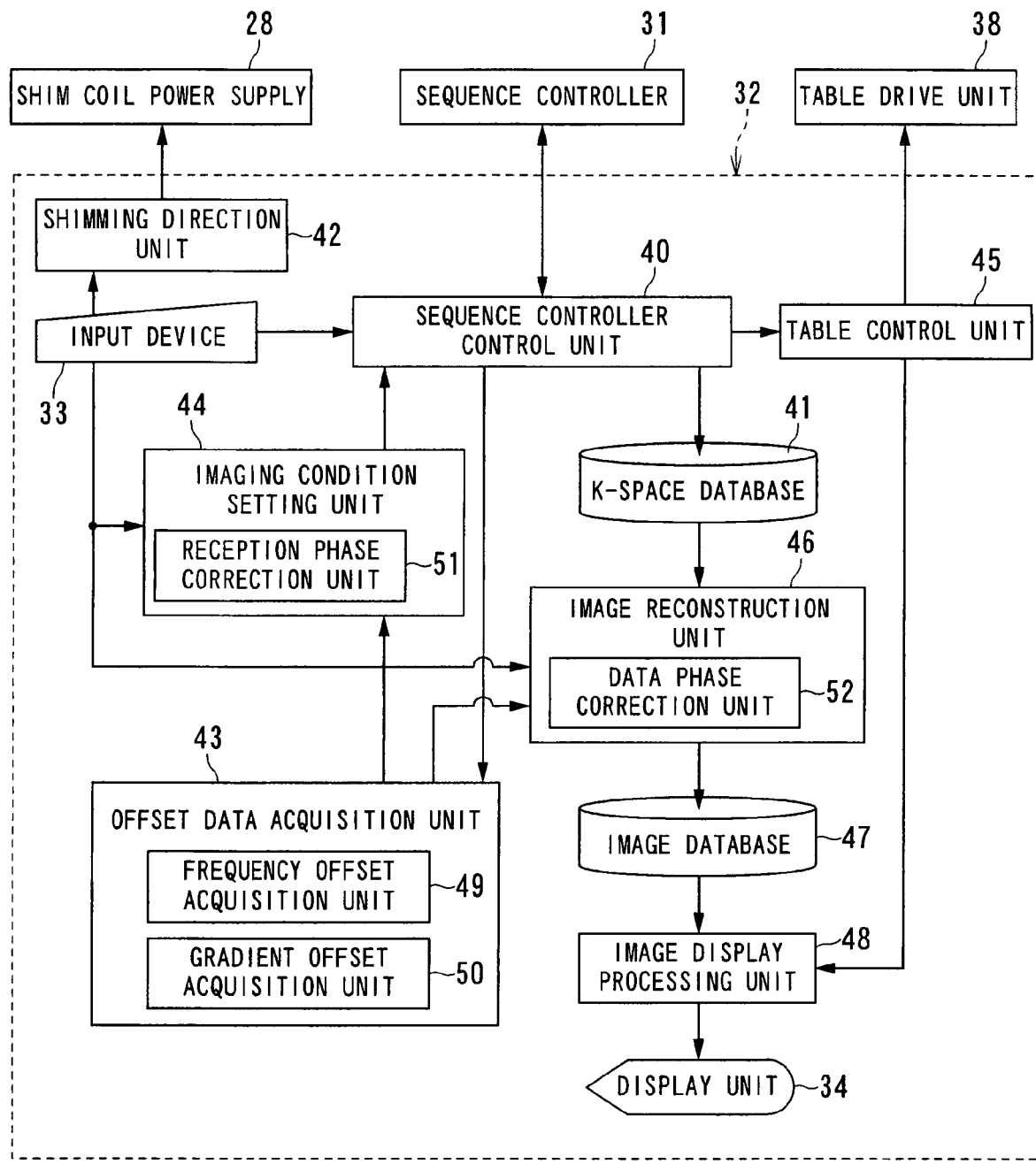
FIG. 7 is a functional block diagram of the magnetic resonance imaging apparatus shown in FIG. 1.

FIG. 7 is a functional block diagram of the magnetic resonance imaging apparatus 20 shown in FIG. 1.

The computer 32 functions as a sequence controller control unit 40, a k-space database 41, a shimming direction unit 42, an offset data acquisition unit 43, an imaging condition setting unit 44, a table control unit 45, an image reconstruction unit 46, an image database 47 and an image display processing unit 48 by program. The offset data acquisition unit 43 includes a frequency offset acquisition unit 49 and a gradient offset acquisition unit 50. Furthermore, the imaging condition setting unit 44 includes a reception phase correction unit 51 and the image reconstruction unit 46 includes a data phase correction unit 52.

The sequence controller control unit 40 has a function for controlling the driving of the sequence controller 31 by giving a pulse sequence acquired from the imaging condition setting unit 44 to the sequence controller 31 based on information from the input device 33 or another element. In addition, the sequence controller control unit 40 has a function for receiving raw data which is k-space (Fourier space) data from the sequence controller 31 and arranging the raw data to k space formed in the k-space database 41. Furthermore, the sequence controller control unit 40 is configured so as to provide the table control unit 45 with information on position control of the bed 37 such that the bed 37 is moved at an appropriate timing in a scan by a pulse sequence, when images are acquired with a movement of the bed 37.

The k-space database 41 stores each pieces of raw data generated by the receiver 30 as k-space data.

The shimming direction unit 42 has a function of causing the shim coil power supply 28 to perform an adjustment of the static magnetic field necessary for shimming, by providing the shim coil power supply 28 with control information for performing the shimming in accordance with instruction information from the input device 33.

The offset data acquisition unit 43 has a function of determining offset data necessary for setting of a pulse sequence for imaging by obtaining data acquired by a pre-scan performed through the shimming, from the sequence controller control unit 40, and a function of providing the determined offset data to the imaging condition setting unit 44. The frequency offset acquisition unit 49 is configured to acquire a frequency offset, while the gradient offset acquisition unit 50 is configured to acquire a gradient magnetic field offset. Here, the frequency offset can be provided to the image reconstruction unit 46, as well.

That is, in the shimming, in a state where the static magnetic field has been adjusted, echo data is acquired by the pre-scan, and offset data such as frequency offset or gradient magnetic field offset is determined based on the acquired echo data. Here, it is desirable that the shimming be so-called volume shimming, which is three-dimensional shimming. In the volume shimming, echo data is acquired by a three-dimensional pre-scan with encoding, and offset data such as the frequency offset or gradient magnetic field offset is determined based on the acquired three-dimensional echo data.

Figure 8:
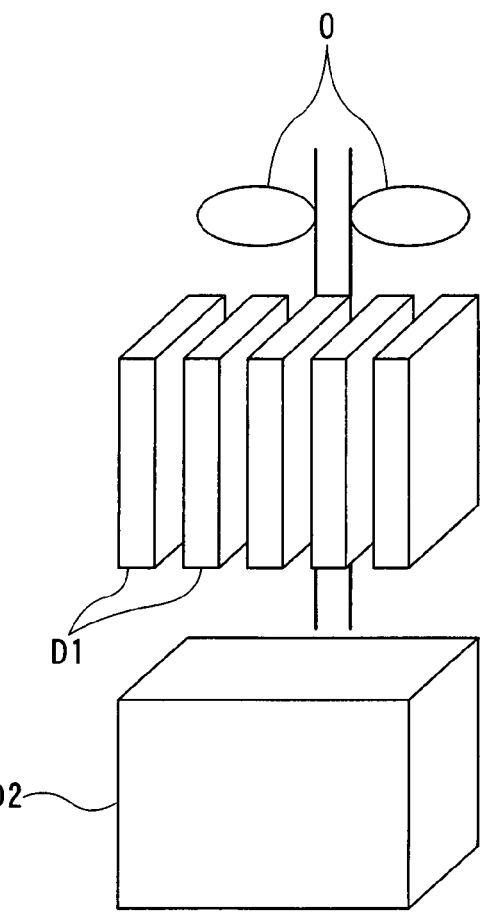
FIG. 8 is a diagram explaining a merit in case of obtaining offset data by volume shimming in the magnetic resonance imaging apparatus shown in FIG. 1.

FIG. 8 is a diagram explaining a merit in case of obtaining offset data by volume shimming in the magnetic resonance imaging apparatus 20 shown in FIG. 1.

As shown in FIG. 8, provided that a structure O in the object P is, for example, discontinuous, when attempting to acquire two-dimensional data D1 in shimming, there is a possibility that the offset data cannot be correctly calculated, because there is no information on a slice corresponding to a portion without tissue, in which the structure O is discontinuous. In addition, when the offset data is acquired from the two-dimensional data D1, a gap between data corresponding to mutually different slices also affects the accuracy of the offset data.

In contrast, acquiring three-dimensional data D2 by volume shimming to thereby acquire the offset data from the three-dimensional data D2, makes it possible to eliminate the gap between data, and to calculate the offset data even when the structure O is discontinuous.

The imaging condition setting unit 44 has a function of setting imaging conditions such as a reception phase of pulse sequence or data in accordance with instruction information from the input device 33, and a function of performing the frequency correction of an excitation pulse and the correction of a gradient magnetic field pulse in the pulse sequence, using the frequency offset and gradient magnetic field offset acquired from the offset data acquisition unit 43. The imaging conditions such as the pulse sequence that has been ultimately produced in the imaging condition setting unit 44 and the data reception phase that has been set there are provided to the sequence controller control unit 40.

Pulse sequences set by the imaging condition setting unit 44 include an EPI sequence such as an SS SE EPI sequence, an SS FE EPI (Single Shot Field Echo Echo Planar Imaging) sequence, an MS SE EPI (Multi-Shot Spin Echo Echo Planar Imaging) sequence, an MS FE EPI (Multi-Shot Field Echo Echo Planar Imaging) sequence, an FFE EPI (Fast Field Echo Echo Planar Imaging) sequence and an HY EPI (Hybrid Echo Planar Imaging) sequence, which acquire a plurality of echo signals after excitation, as well as a pulse sequence for a pre-scan to acquire offset data.

In the imaging condition setting unit 44, it can be set, as an imaging condition, whether a parallel imaging (PI) for acquiring echo data using a plurality of the surface coils 24c is to be performed. The PI is imaging that receives echo data using a plurality of the surface coils 24c and that reduces the number of phase encodes to the value obtained by dividing the number of phase encodes necessary for image reconstruction by the number of the surface coils 24c, by skipping phase encodes. In many case, the scan under the EPI method by which a plurality of echo signals is continuously acquired is executed by this PI. When the PI is performed, information necessary for the PI, including the number of the surface coils 24c used for echo data acquisition, and information relating each of the surface coils 24c to an imaging area, is set as imaging conditions.

The reception phase correction unit 51 in the imaging condition setting unit 44 has a function of shifting the reception phase of echo data so that echo data acquired by the execution of the pulse sequence is received in a state where the shift of the reception phase has been cancelled. The on/off switching of activity of the phase setting function of the reception phase correction unit 51 can be performed by an operation with respect to the input device 33. The shift of the reception phase can be executed, in a concrete term, by the control of the receiver 30.

Figure 9:
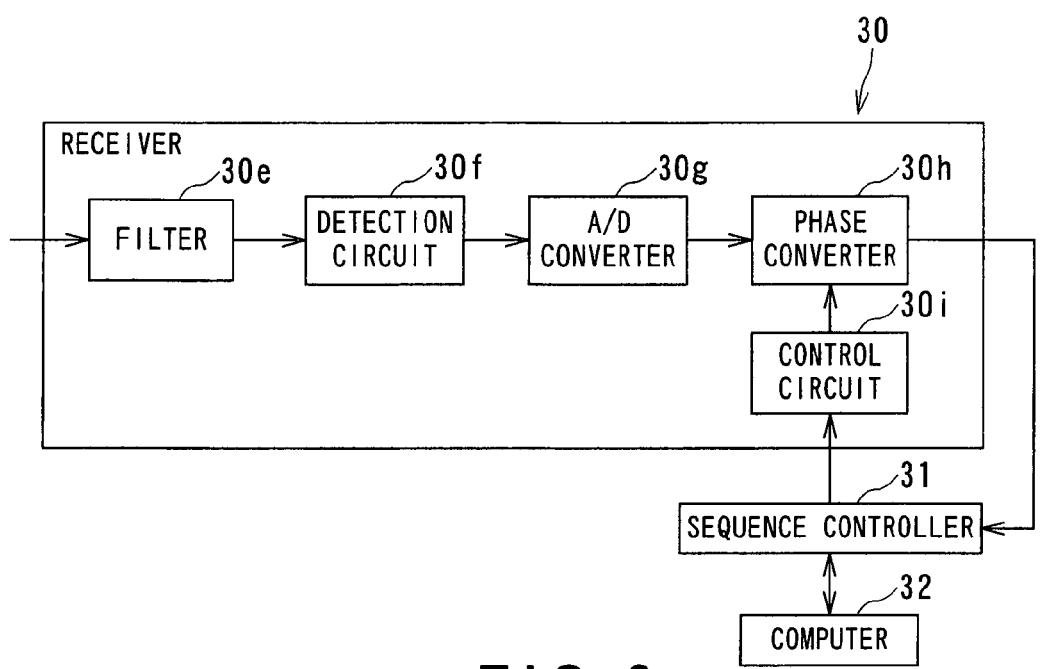
FIG. 9 is a diagram showing an example of detail structure of the receiver shown in FIG. 1.

FIG. 9 is a diagram showing an example of detail structure of the receiver 30 shown in FIG. 1.

FIG. 9 show a constructional example when the receiver 30 is a digital receiver. When the receiver 30 is configured as in FIG. 2, FIG. 9 corresponds to a constructional example of reception circuits 30d.

The receiver 30 includes a filter 30e, a detection circuit 30f, an A/D converter 30g, a phase converter 30h and a control circuit 30i. An MR signal received in the RF coil unit 24 is gotten rid of unnecessary components by the filter 30e in the receiver 30, and then outputted to the detection circuit 30f. In the detection circuit 30f, the signal is detected, and the signal obtained by the detection is outputted to the A/D converter 30g. Then, the MR signal digitalized in the A/D converter 30g is outputted to the phase converter 30h. In the phase converter 30h, the reception phase of the MR signal serving as echo data is shifted by a predetermined value. The echo data having the reception phase thus shifted is outputted to the computer 32 through the sequence controller 31.

The-shift amount of reception phase in the phase converter 30h is controlled in accordance with a control signal from the control circuit 30i. That is, the control circuit 30i is provided with a shift amount of reception phase from the reception phase correction unit 51 in the computer 32 via the sequence controller 31, and controls the phase converter 30h so that the shift amount of reception phase in the phase converter 30h becomes the shift amount of the reception phase acquired from the reception phase correction unit 51.

Meanwhile, when the receiver 30 is an analog receiver, the A/D converter 30g is disposed at a stage subsequent to the phase converter 30h, and a low pass filter (LPF) is used as the filter 30e.

The table control unit 45 has the function of controlling the table drive unit 38 based on pulse sequence information acquired from the sequence controller control unit 40 so that the position of the table of the bed 37 moves to an appropriate position in keeping with the execution of the pulse sequence; and the function of providing position information on the bed 37 to the image display processing unit 48.

The image reconstruction unit 46 has a function of producing image data from k-space data by capturing the k-space data from the k-space database 41 and performing necessary image processing such as image reconstruction processing including two-dimensional or three-dimensional Fourier-transform processing, or other MPR processing or maximum intensity projection (MIP) processing; and a function of writing the produced image data into the image database 47. In particular, when echo data is acquired by the PI, unfolded image data is produced by performing unfolding processing, which is post-processing in the PI, with respect to image data corresponding to each of the surface coils 24c based on PI conditions. For the unfolding processing, the sensitivity distribution of each of the surface coils 24c is used.

The data phase correction unit 52 in the image reconstruction unit 46 has the function of making a correction for shifting the k-space data in the reverse direction by a phase shift amount so that the phase shift of the k-space data is cancelled when k-space data has been acquired without the reception phase of echo data being corrected in the reception phase correction unit 51 of the imaging condition setting unit 44 so that echo data is received in a state where the shift of the reception phase in the echo data has been cancelled. That is, the data phase correction unit 52 is configured so as to shift the phase of k-space data by the phase shift in response to the frequency offset. The on/off switching of activity of the phase correction function of the data phase correction unit 52 can be performed by an operation with respect to the input device 33.

The image database 47 has a function to store the image data produced by the image reconstruction unit 46.

The image display processing unit 48 has a function of performing necessary display processing to image data read from the image database 47, and then providing the processed data to the display unit 34 to thereby display it. When a plurality of images acquired with a movement of the bed 37 is to be displayed as a single image, the image display processing unit 48 is configured to read a plurality of corresponding pieces of image data from the image database 47 to perform compound processing for joining together the corresponding pieces based on position information of the bed 37 acquired from the table control unit 45.

Next, operations and effects of the magnetic resonance imaging apparatus 20 will be described.

Figure 10:
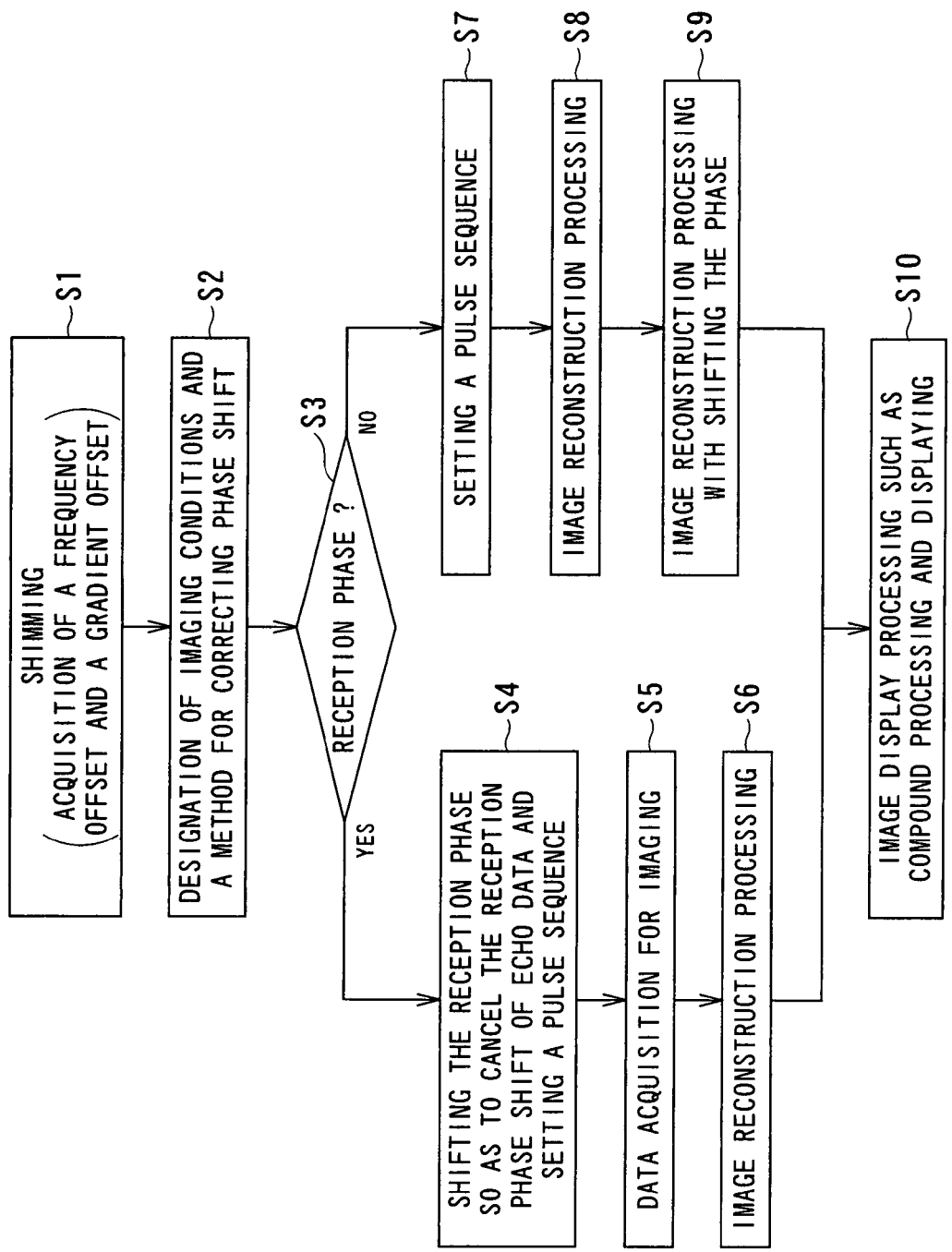
FIG. 10 is a flowchart showing a procedure for imaging the object by the magnetic resonance imaging apparatus shown in FIG. 1.

FIG. 10 is a flowchart showing a procedure for imaging the object P by the magnetic resonance imaging apparatus 20 shown in FIG. 1. The symbols including S with a number in FIG. 10 indicate each step of the flowchart.

In step S1, a frequency offset and a gradient magnetic field offset are determined by shimming. That is, when a direction to execute shimming is given to the shimming direction unit 42 from the input device, the shimming direction unit 42 provides the shim coil power supply 28 with control information for performing the shimming. Thereupon, a current is supplied from the shim coil power supply 28 to the shim coil 22, resulting in a uniformalized static magnetic field.

Furthermore, a pulse sequence for pre-scan for the purpose of acquiring offset data is provided from the imaging condition setting unit 44 to the sequence controller 31 through the sequence controller control unit 40. Based on the pulse sequence for pre-scan, the sequence controller 31 drives the gradient power supply 27, the transmitter 29, and the receiver 30 to generate an x-axis gradient magnetic field Gx, a y-axis gradient magnetic field Gy, a z-axis gradient magnetic field Gz, and an RF signal. MR signals generated by nuclear magnetic resonance of proton spins inside the object P are received by the RF coil unit 24, and they are given to the offset data acquisition unit 43 through the receiver 30, the sequence controller 31, and the sequence controller control unit 40. That is, the data acquired by the execution of the pre-scan is provided to the offset data acquisition unit 43.

The frequency offset acquisition unit 49 in the offset data acquisition unit 43 acquires a frequency spectrum of signals from the data acquired by the pre-scan. The frequency offset acquisition unit 49 then determines the resonance frequency of an imaging portion from the frequency spectrum, and determines the amount of shift from a reference frequency as a frequency offset.

Figure 11:
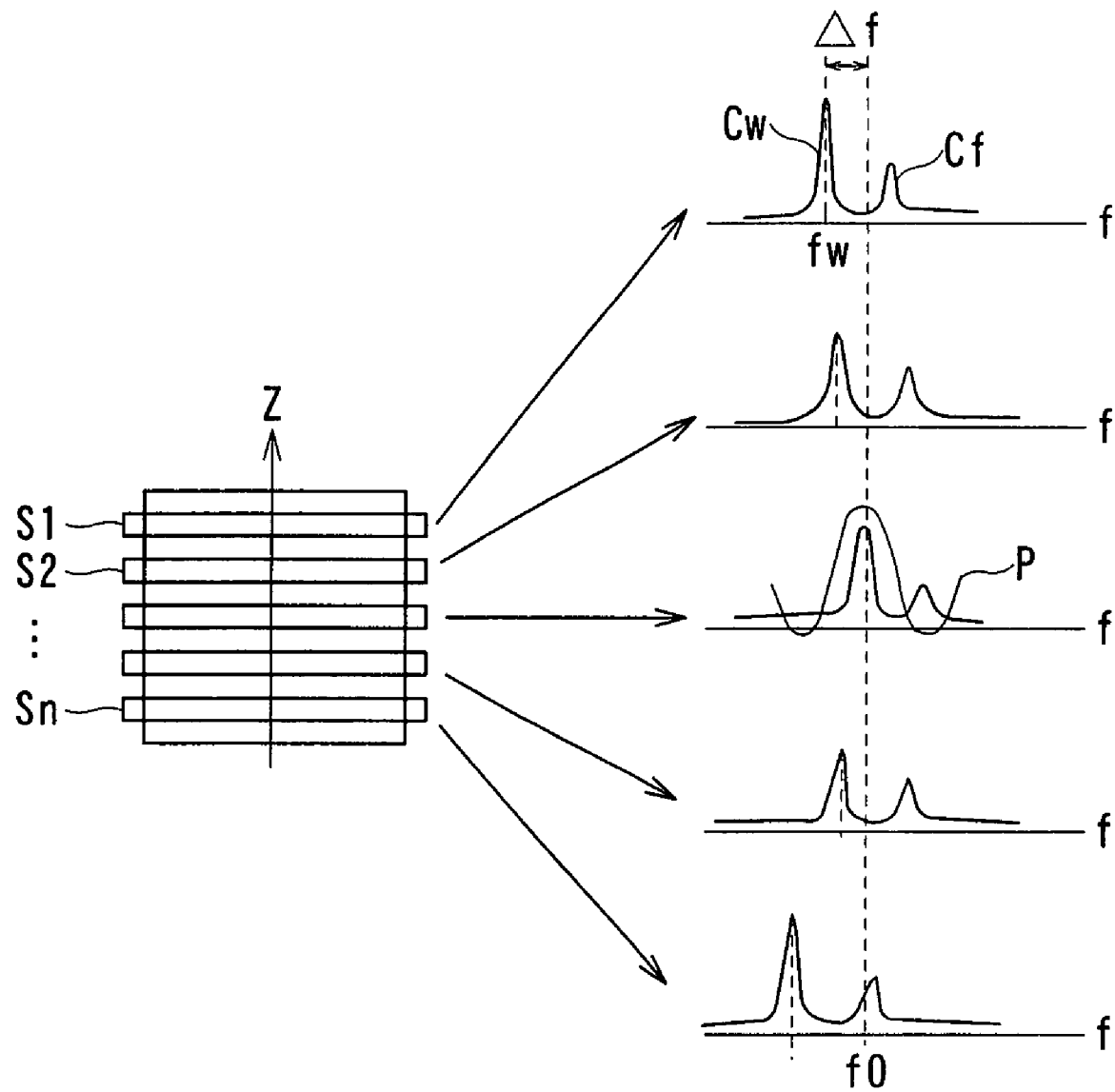
FIG. 11 is a diagram showing an example of frequency offset obtained by the frequency offset acquisition unit shown in FIG. 7.

FIG. 11 is a diagram showing an example of frequency offset obtained by the frequency offset acquisition unit 49 shown in FIG. 7.

FIG. 11(a) shows positions in the z-direction, of a plurality of slices S1, S2, ... Sn that are to be imaged. FIG. 11(b) shows a frequency spectrum of a signal acquired at the position of each of the slices, wherein the abscissa denotes the frequency F, and the ordinate denotes the signal intensity. As shown in FIG. 11, in each of the frequency spectra of signals, there appear a peak Cw of the resonance frequency of protons included in the water area, and a peak Cf of the resonance frequency of protons included in the fat area, and these peaks Cw and Cf each varies from slice to slice. Hence, in order to adjust the center frequency of an excitation pulse applied to each of the slices to a resonance frequency fw in the water area included in an imaging target, the difference between the resonance frequency corresponding to each of the slices and the reference frequency f0 is determined as the frequency offset Δf. Then, the determined frequency offset is provided from the offset data acquisition unit 43 to the imaging condition setting unit 44 and the image reconstruction unit 46.

The gradient offset acquisition unit 50 determines a gradient magnetic field offset. Specifically, since the resonance frequencies in slice areas are different from each other, the difference between the gradient magnetic field for sufficiently exciting the area in each of the slices and the reference gradient magnetic field is determined as the gradient magnetic field offset. The determined gradient magnetic field offset is provided from the offset data acquisition unit 43 to the imaging condition setting unit 44.

Next, in step 2, an imaging condition is set by an operation with respect to the input device 33. A correcting method for a phase shift occurring in echo data due to a frequency modulation arising during the reading-out of echo data, is designated by the operation with respect to the input device 33. For example, by instruction information being provided from the input device 33 to the imaging condition setting unit 44, SS SE EPI sequence is designated, and the imaging condition under a moving table method with a movement of the table of the bed 37 is designated.

Correction methods for the phase shift occurring in echo data include a method wherein the phase shift of reception phase of echo data is cancelled, and a method wherein the phase shift is corrected in image reconstruction processing of acquired k-space data. This being the case, an operator switches on the operation mode of a correction function of the phase shift by an operation with respect to the input device 33, and selects whether the reception phase is to be corrected or the phase of the k-space data is to be corrected. That is, an operation instruction is provided from the input device 33 to either one of the reception phase correction unit 51 in the imaging condition setting unit 44 and the data phase correction unit 52 in the image reconstruction unit 46.

Here, the designation of imaging condition, the operation instruction for the correction function for phase shift, and a correction method for phase shift may be each performed prior to shimming in step S1.

Next, if, in step S3, the reception phase of echo data is designated as a correction target, then, in step S4, in the imaging condition setting unit 44, the imaging condition is set so that the reception phase shift of echo data is cancelled. Also, in the imaging condition setting unit 44, a correction is performed using the frequency offset and the gradient magnetic field offset.

Figure 12:
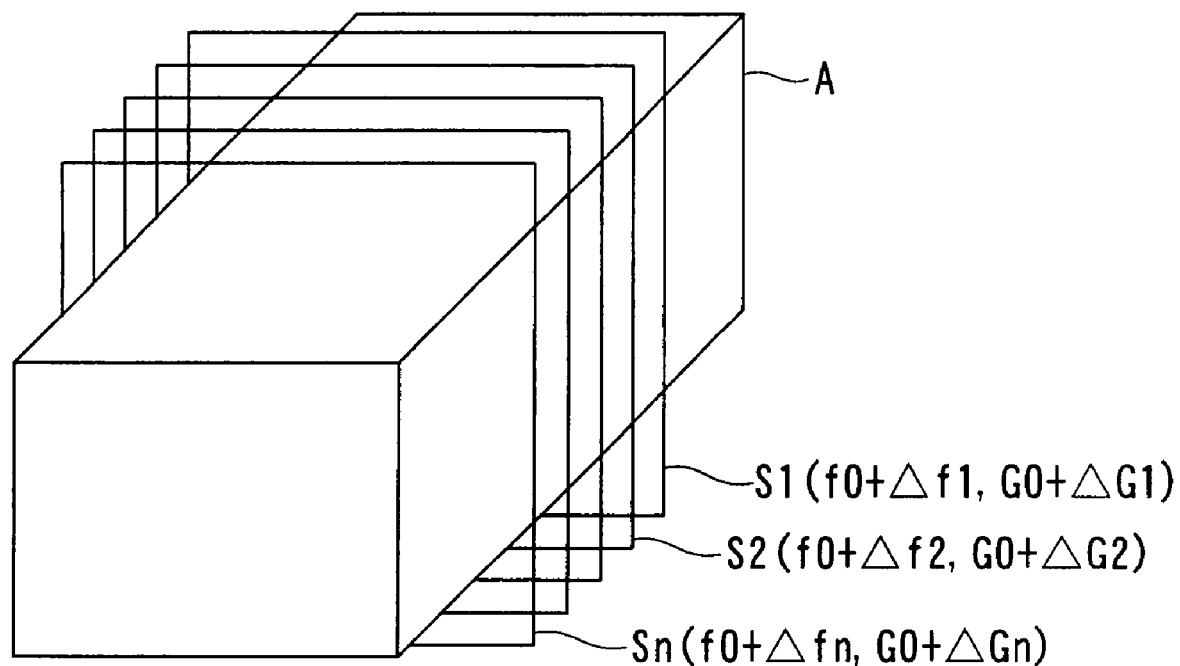
FIG. 12 is a conceptual diagram explaining a correction method with the frequency offset and the gradient offset in the imaging condition setting unit shown in FIG. 7.

FIG. 12 is a conceptual diagram explaining a correction method with the frequency offset and the gradient offset in the imaging condition setting unit 44 shown in FIG. 7.

As shown in FIG. 12, a plurality of slices S1, S2, ... Sn are set in an imaging area A. The center frequencies of excitation pulses applied into the slices S1, S2, ... Sn are shifted from the reference frequency f0 respectively, by frequency offsets Δf1, Δf2, ... Δfn corresponding to the respective slices S1, S2, ... Sn. Also, the gradient magnetic field pulses applied into the slices S1, S2, ... Sn are provided with intensities respectively incremented by gradient magnetic field offsets ΔG1, ΔG2, ... ΔGn corresponding to the respective slices S1, S2, ... Sn, to the intensity G0 of reference gradient magnetic field pulse.

For example, if a frequency offset in a slice is Δf=20 Hz, the center frequency of excitation pulse has a frequency offset of 20 Hz. In this case, while being read out, the echo signal is frequency-modulated by an amount corresponding to the frequency offset. If the gradient magnetic field offsets in a corresponding slice in the phase encode (PE) direction, readout (RO) direction, and slice selection (SS) direction are ΔG (PE, RO, SS)=(5, −2, 7), then, the control values of the respective gradient magnetic field pulses are incremented by the gradient magnetic field offsets ΔG (PE, RO, SS)=(5, −2, 7).

Figure 13:
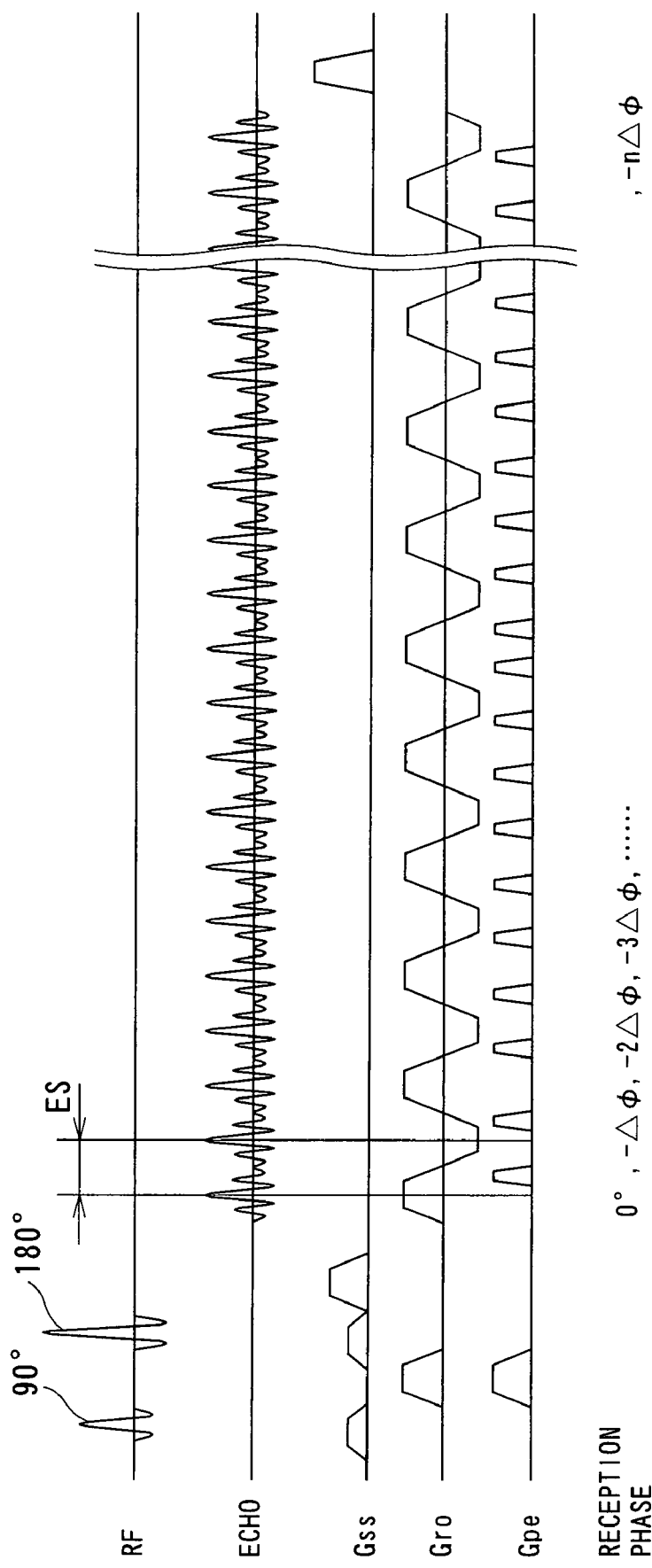
FIG. 13 is a diagram showing an example of pulse sequence set by the imaging condition setting unit shown in FIG. 7.

FIG. 13 is a diagram showing an example of pulse sequence set by the imaging condition setting unit 44 shown in FIG. 7.

In FIG. 13, RF denotes an RF signal transmitted from the RF coil unit 24, ECHO denotes echo data to be received, Gss denotes a gradient magnetic field for slice selection, Gro denotes a gradient magnetic field for readout, Gpe denotes a gradient magnetic field for phase encoding and RECEPTION PHASE denotes a reception phase of the echo data.

As shown in FIG. 13, in the SS SE EPI sequence, following the application of a 90° excitation pulse, a 180° refocus pulse is applied. Also, a slice to be excited is selected by the application of a gradient magnetic field Gss for slice selection. Following the refocus of protons in the slice by the 180° refocus pulse, a gradient magnetic field Gro for readout and a gradient magnetic field Gpe for phase encode are each continuously applied at a plurality of times. As a result, a single excitation allows echo data corresponding to one slice image to be continuously acquired at a constant echo space (ES).

If an excitation is performed using a 90° excitation pulse, in which the frequency is modulated by the frequency offset, and the reception phases of echo data are same as each other, then, phase shifts are superimposed onto the echo data in arithmetic progression in response to the number of data. For example, if a frequency offset is Δf=20 Hz and an echo space is ES=1 ms, then, the phase shift Δφ between mutually adjacent echo data can be calculated by the following expression (1).

$$\Delta\phi = \Delta f \times ES \times 360 = 20\ (Hz) \times \frac{1}{1000}(s) \times 360° = 7.2° \quad (1)$$

This being the case, in order that the phase shift corresponding to frequency modulation between the mutually adjacent echo data is cancelled, the reception phase of the echo data is preset so as to be shifted in the direction opposite to the direction of the phase shift due to frequency modulation of the echo data. For example, if the phase shift is Δφ=7.2° and the reception phase of echo data acquired directly after a refocus pulse application is 0°, then, the reception phase of echo data to be secondly acquired is set to be −Δφ=7.2°. Furthermore, the reception phase of echo data to be thirdly acquired is set to be −2 Δφ=−14.4°. In this manner, the reception phases of echo data are set as an arithmetic progression such that the reception phase of adjacent echo data is shifted by −7.2° relative to the preceding echo data.

That is, the reception phase is shifted by an amount obtained by superposing, in accordance with each readout position in the PE direction, the phase shift due to the frequency modulation at readout of echo data with the frequency modulation equivalent to that used for the excitation pulse. For example, when the phase shift Δφ of echo data with the frequency modulation equivalent to that of the excitation pulse is 7.2°, the reception phase to be set at every readout position in the PE direction is changed by 7.2°.

By canceling the phase shift of echo data, it is possible to suppress the positional shift, due to the frequency modulation, of image data that is reconstructed using k-space data.

In this manner, previously shifting the reception phase of echo data allows the image position shift and the phase shift of k-space data that are affected by the frequency modulation equivalent to that of the excitation pulse, to be suppressed in a shorter processing time, without the need for new phase correction processing. Moreover, since the reception phase of echo data is shifted based on the frequency offset determined based on the imaging portion, the reception phase shift independent of the imaging portion is feasible.

Next, in step S5, data acquisition for imaging is performed. Specifically, the imaging condition setting unit 44 provides the sequence controller 31 via the sequence controller control unit 40, with SS SE EPI sequence and reception phase information after the echo data has been shifted, as imaging conditions. The sequence controller 31 drives the gradient magnetic field power source 27, the transmitter 29, and the receiver 30 under the SS SE EPI sequence to generate an x-axis gradient magnetic field Gx, a y-axis gradient magnetic field Gy, a z-axis gradient magnetic field Gz, and an RF signal. Then, MR signals generated by nuclear magnetic resonance of proton spins inside the object P are received by the RF coil unit 24, and placed into the k-space database 41 through the receiver 30, the sequence controller 31, and the sequence controller control unit 40.

Figure 14:
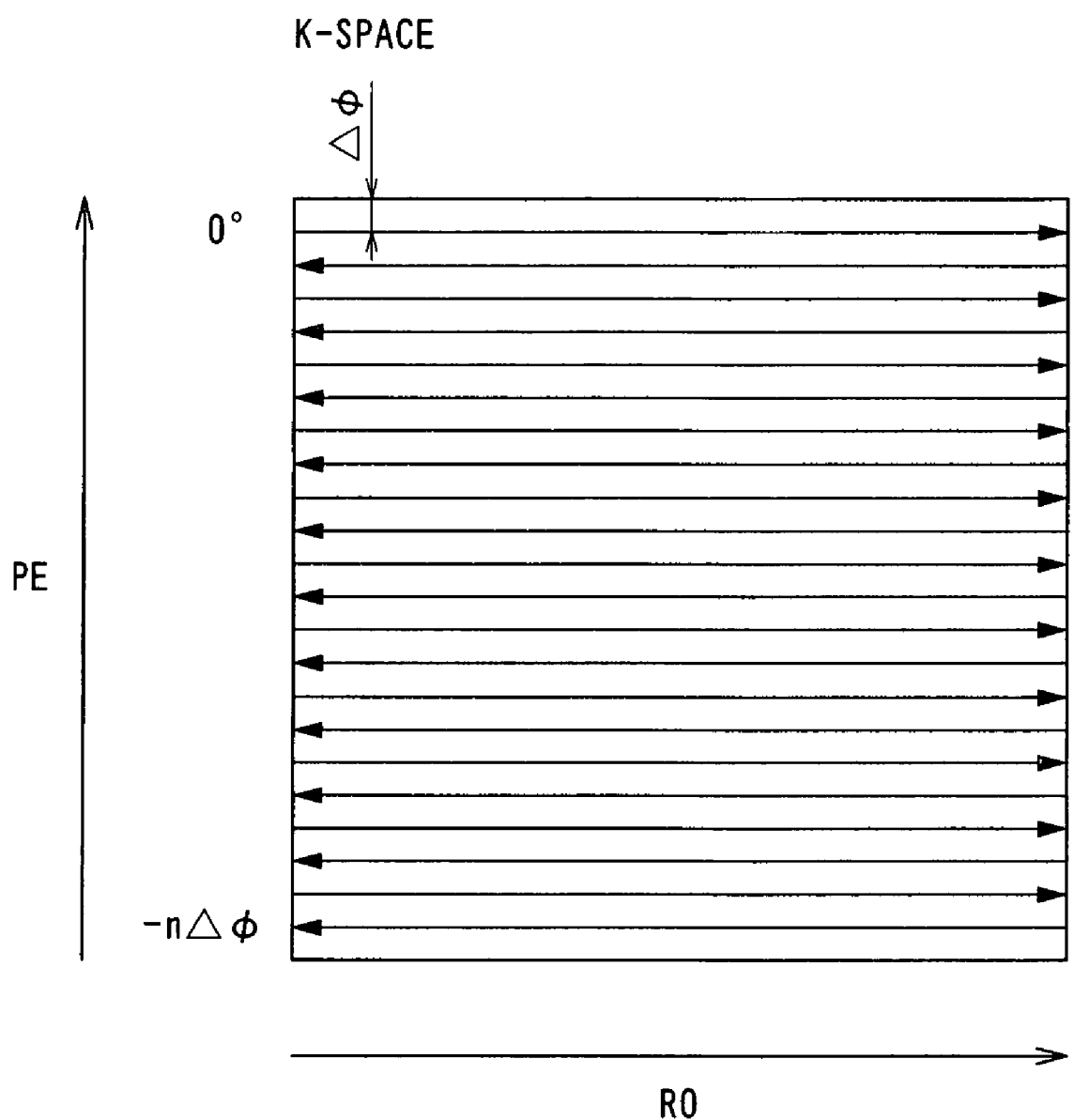
FIG. 14 is a diagram showing an arrangement of k-space data acquired with shifting a reception phase of echo data by performing a scan under the pulse sequence shown in FIG. 13.

FIG. 14 is a diagram showing an arrangement of k-space data acquired with shifting a reception phase of echo data by performing a scan under the pulse sequence shown in FIG. 13.

In FIG. 14, the abscissa denotes the RO direction and the ordinate denotes the PE direction. Further, each arrowhead in FIG. 14 denotes a direction for acquiring k-space data. As shown in FIG. 14, between adjacent positions of k-space data in the PE direction, a time corresponding to the echo space ES elapses. Since reception phases that have been shifted every RO have been set, the phase shifts that subjects to influence on frequency modulation of the excitation pulse, is cancelled. If the phase shift resulting from being subjected to influence on frequency modulation of the excitation pulse, is not cancelled, then, the k-space data would be shifted superimposedly in the PE direction. However, in actuality, as described above, since the reception phase of echo data is preset so as to be shifted in the direction opposite to the direction of the phase shift, the phase information on the PE direction of the k-space data is corrected.

When imaging conditions under the moving table method is provided from the imaging condition setting unit 44 to the sequence controller control unit 40, pulse sequence information is given from the sequence controller control unit 40 to the table control unit 45. Thereupon, based on the pulse sequence information, the table control unit 45 controls the table drive unit 38 so that the table position of the bed 37 moves to an appropriate position in keeping with the execution of the pulse sequence. This makes it possible to perform the acquisition of the k-space data as described above while moving the table position of the bed 37. The table control unit 45 also provides the image display processing unit 48 with the position information of the bed 37 at a time when data is acquired.

Next, in step S6, the image reconstruction unit 46 reads k-space data from the k-space database 41, and subjects the read-in k-space data to image reconstruction processing, and other necessary image processing such as MPR processing and MIP processing, whereby image data is produced from the k-space data. The image reconstruction unit 46 writes the reconstructed image data into the image database 47.

On the other hand, if it is determined in step S3 that an instruction for performing a correction of phase shift in the image reconstruction processing of k-space data has been made, imaging conditions such as a pulse sequence are set in the imaging condition setting unit 44 in step S7. Also, the center frequency of excitation pulse and a gradient magnetic field pulse are corrected using a frequency offset and gradient magnetic field offset. However, the shift of the reception phase of echo data is not performed.

Next, in step S8, data for imaging is acquired by the execution of a pulse sequence as in the case of step S5.

Then, in step S9, the image reconstruction unit 46 reads k-space data from the k-space database 41. Here, in the k-space data read by the image reconstruction unit 46, there exists a phase shift due to the influence of the frequency modulation of excitation pulse. Such being the case, the data phase correction unit 52 corrects the k-space data so that the phase shift of the k-space data is cancelled. That is, the data phase correction unit 52 shifts the phase of the k-space data by phase shift Δφ in response to the frequency offset as shown in the expression (1).

The image reconstruction unit 46 subjects the k-space data of which the phase shift due to the influence of frequency modulation has been cancelled by shifting the phase, to image reconstruction processing, and other necessary image processing such as MPR processing and MIP processing, whereby produced image data is written into the image database 47.

Next, in step S10, the image display processing unit 48 reads image data from the image database 47, and after having performed necessary display processing, provide the processed data to the display unit 34 for displaying. In particular, when a plurality of image data is acquired from many wide-ranging slices with a movement of the bed 37, image data corresponding to each of the slices is read from the image database 47 into the image display processing unit 48. Based on the position information on the bed 37, acquired from the table control unit 45, the image display processing unit 48 performs composition processing for placing individual images at proper positions and joining them into a single image. The wide range of image data produced by this composition processing is displayed on the display unit 34.

Here, regarding the image displayed on the display unit 34, since echo data phase shift affected by the frequency modulation of excitation pulse has been cancelled by the shift of the reception phase of echo data or the phase shift of k-space data, the displayed image becomes an image without positional shift. Especially, an image produced by joining together a plurality of images becomes an image without steps in joint portions.

Figure 15:
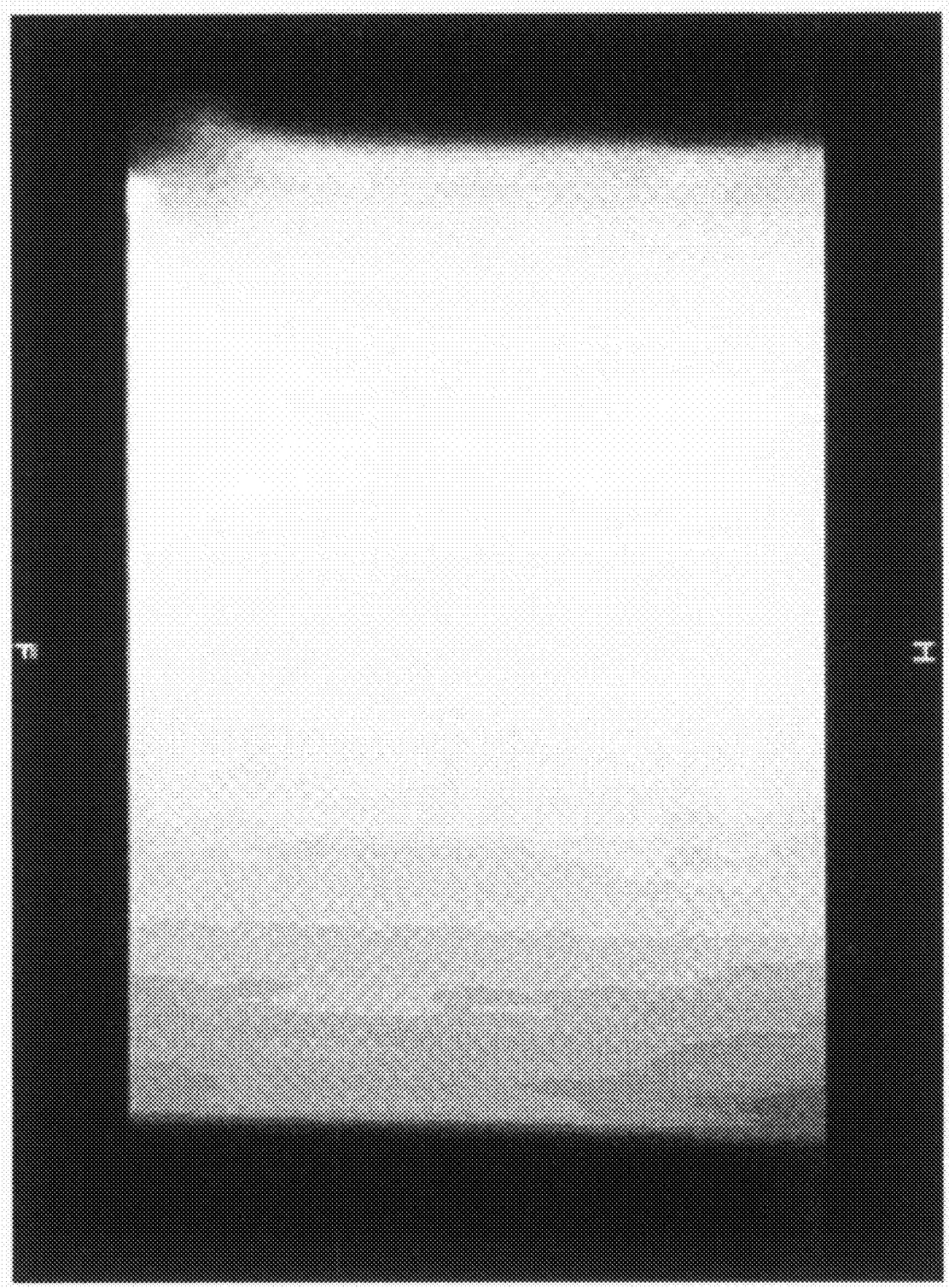
FIG. 15 is a diagram showing an example of image obtained by performing a scan under SS SE EPI method by the magnetic resonance imaging apparatus shown in FIG. 1.
Figure 16:
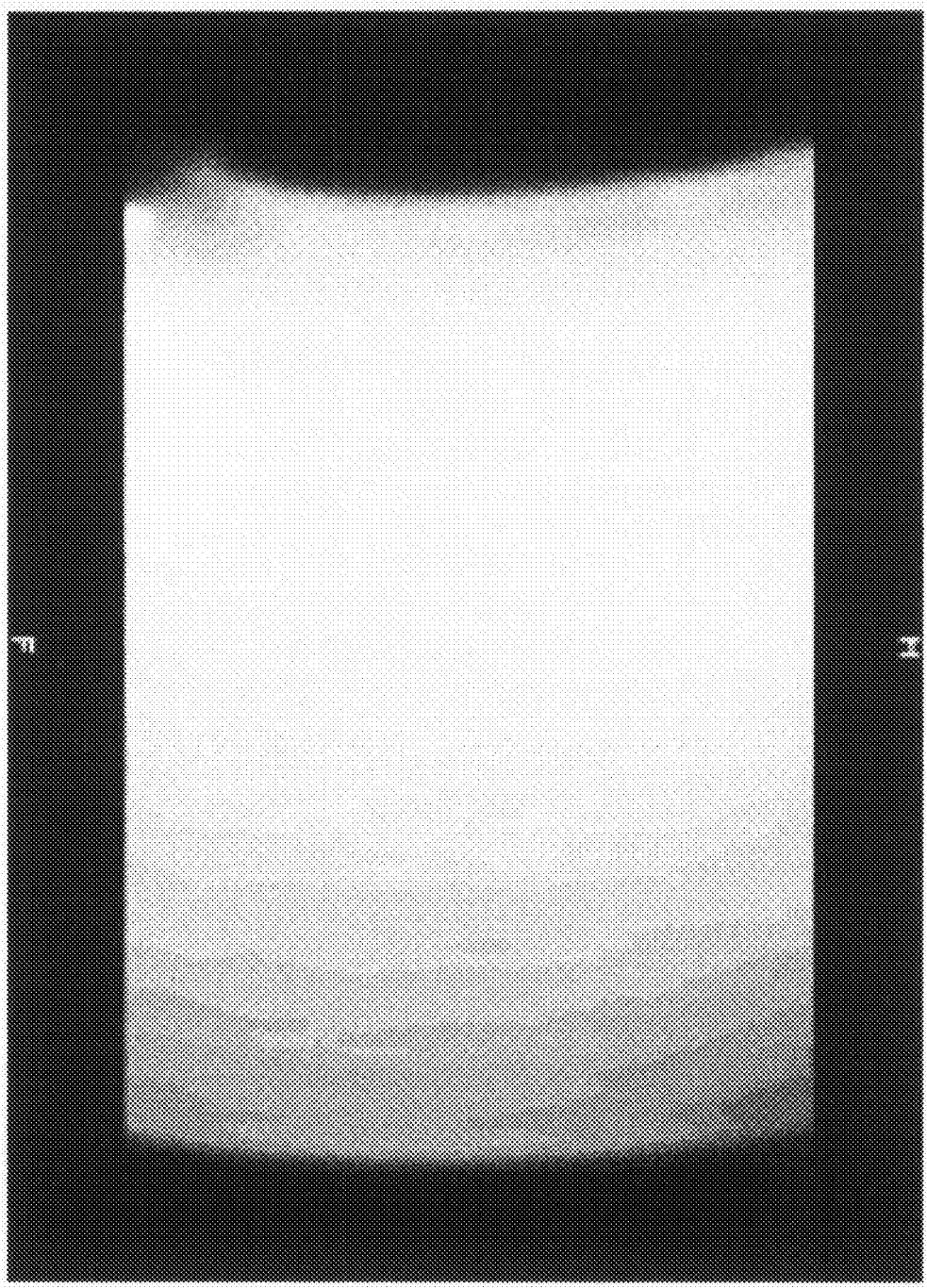
FIG. 16 is a diagram showing one example of image which was obtained by a scan under the conventional SS SE EPI method.

FIG. 15 is a diagram showing an example of image obtained by performing a scan under SS SE EPI method by the magnetic resonance imaging apparatus 20 shown in FIG. 1.

FIG. 15 shows a sagittal sectional view of elliptic-cylindrical copper sulfate bottle phantom. This sagittal image is produced by imaging a plurality of axial sectional images included in an area having a width on the level of 15 cm in an axial direction by means of SS SE EPI sequence, and by subjecting the acquired axial sectional images to MPR processing.

The image shown in FIG. 15 is obtained so as to be prevented from being affected by the frequency modulation in the excitation pulse, that is, this image has been obtained from data acquired so that the phase shift is cancelled, and therefore, it can be ascertained from this image in FIG. 15 that the position shift of the image has been suppressed.

As described above, the magnetic resonance imaging apparatus 20 makes a phase correction such that the phase shift of reception data or data after the reception is cancelled independently of the imaging portion, by using a frequency offset of a respective one of the excitation pulses determined by shimming in accordance with an imaging portion. This allows the magnetic resonance imaging apparatus 20 to acquire an image in which a positional shift to the encode direction, due to the phase shift of k-space data, has been suppressed.

Furthermore, when a single wide-ranging image is acquired by joining together a plurality of images obtained by imaging with a movement of the bed 37, positional shifts of the images to be joined are suppressed by phase corrections, and therefore, the images can be smoothly joined together. In other words, it is possible to achieve a wide-ranging image with few steps in joint portions.

What is claimed is:

1. A magnetic resonance imaging apparatus comprising:
   a data acquisition unit configured to acquire pieces of echo data due to nuclear magnetic resonance after applying an excitation pulse;
   a frequency offset acquisition unit configured to acquire a frequency offset;
   a frequency modulation unit configured to frequency-modulate the excitation pulse according to the frequency offset based on echo data acquired by a pre-scan; and
   a phase shift correction unit configured to cancel a phase shift occurring on each of the pieces of the echo data due to a frequency modulation according to the frequency offset during a readout of the pieces of the echo data.

2. A magnetic resonance imaging apparatus according to claim 1,
   wherein said phase shift correction unit is configured to cancel the phase shift by shifting a reception phase of each of the pieces of the echo data by the phase shift in an inverse direction.

3. A magnetic resonance imaging apparatus according to claim 1,
   wherein said phase shift correction unit is configured to cancel the phase shift by shifting a phase of each of the pieces of the echo data after acquisition by the phase shift in an inverse direction.

4. A magnetic resonance imaging apparatus according to claim 1,
   wherein said data acquisition unit is configured to acquire the pieces of the echo data according to a sequence under Echo Planar Imaging method.

5. A magnetic resonance imaging apparatus according to claim 1, further comprising:
   a table driving unit configured to move a bed for setting the object;
   an image producing unit configured to produce images corresponding to respective positions of the bed from pieces of echo data after canceling the phase shift respectively, the pieces of echo data being acquired at the respective positions of the bed by said data acquisition unit; and
   an image combining unit configured to combine the images with each other.

6. A magnetic resonance imaging apparatus according to claim 1,
   wherein said frequency offset acquisition unit is configured to acquire the frequency offset from three dimensional data.

7. A magnetic resonance imaging apparatus according to claim 4,
   wherein said data acquisition unit is configured to acquire the pieces of the echo data by parallel imaging in which a number of phase encodings are reduced into a value obtained by multiplying an inverse number of a number of surface coils by a number of phase encoding necessary for image reconstruction by skipping phase encodings necessary for the image reconstruction with the surface coils.

8. A magnetic resonance imaging method comprising:
   acquiring pieces of echo data due to nuclear magnetic resonance after applying an excitation pulse;
   acquiring a frequency offset based on echo data acquired by a pre-scan;
   frequency-modulating the excitation pulse according to the frequency offset; and
   canceling a phase shift occurring on each of the pieces of echo data due to a frequency modulation according to the frequency offset during a readout of the pieces of echo data.

* * * * *